United States Patent [19]

Kurita et al.

[11] Patent Number: 5,038,453
[45] Date of Patent: Aug. 13, 1991

[54] METHOD OF MANUFACTURING SEMICONDUCTOR DEVICES, AND LEADFRAME AND DIFFERENTIAL OVERLAPPING APPARATUS THEREFOR

[75] Inventors: Yoshio Kurita, Kyoto; Akira Akamatsu, Okayama, both of Japan

[73] Assignee: Rohm Co., Ltd., Kyoto, Japan

[21] Appl. No.: 377,969

[22] Filed: Jul. 11, 1989

[30] Foreign Application Priority Data

Jul. 22, 1988 [JP] Japan .................................. 63-184283
Apr. 25, 1989 [JP] Japan .................................. 1-106471

[51] Int. Cl.$^5$ ........................................... H01L 23/48
[52] U.S. Cl. ..................................... 29/25.01; 29/827; 437/206; 437/220; 439/885
[58] Field of Search ............... 437/206, 209, 207, 211, 437/220; 357/70; 29/827, 25.01; 228/4.5

[56] References Cited

U.S. PATENT DOCUMENTS

| | | | |
|---|---|---|---|
| Re. 29,906 | 2/1979 | Jackson | 437/206 |
| 3,698,076 | 10/1972 | Kingsley | 437/206 |
| 3,859,718 | 1/1975 | Noe | 437/206 |
| 4,069,924 | 1/1978 | McCockle | 437/206 |
| 4,252,864 | 2/1981 | Coldren | 357/70 |
| 4,616,250 | 10/1986 | Folk . | |
| 4,850,103 | 7/1989 | Takemoto et al. | 29/827 |
| 4,859,632 | 8/1989 | Lumbard | 437/206 |

FOREIGN PATENT DOCUMENTS 62-35549 2/1987 Japan .

Primary Examiner—Olik Chaudhuri
Assistant Examiner—Andrew Griffis
Attorney, Agent, or Firm—William H. Eilberg

[57] ABSTRACT

The present invention proposes a method of manufacturing semiconductor devices from an elongated leadframe by using a differential overlapping apparatus. The leadframe has longitudinally spaced pairs of staggered leads. The overlapping apparatus functions to deform the leadframe during transfer thereof, so that each pair of staggered leads assumes the same longitudinal position but displaced away from each other perpendicularly to a plane containing the leadframe. The leadframe is further deformed to cause the pair of leads to move toward each other, so that a semiconductor chip is sandwiched between the pair of leads for bonding.

9 Claims, 5 Drawing Sheets

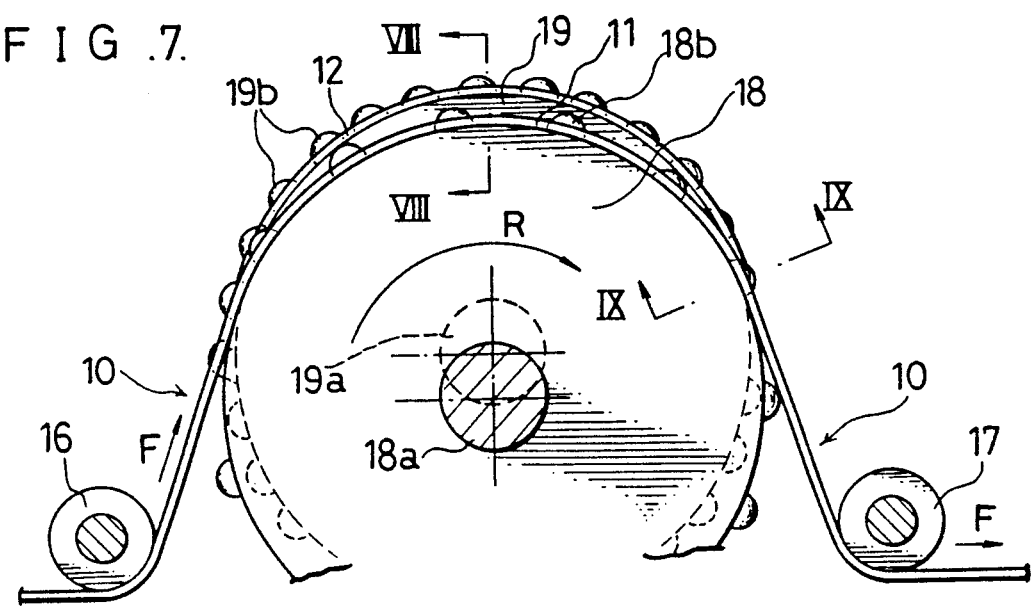
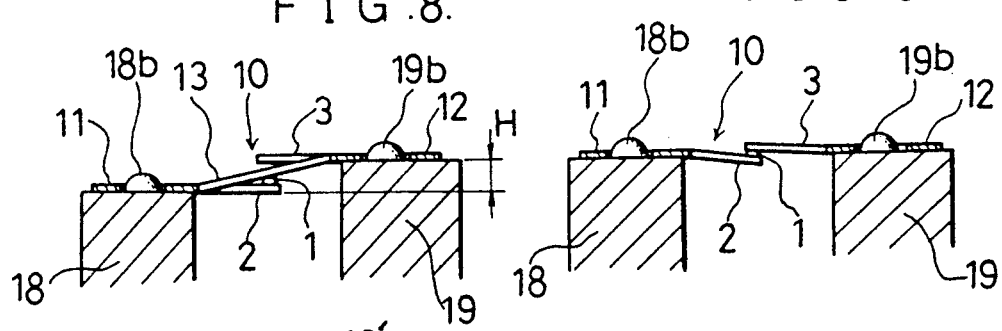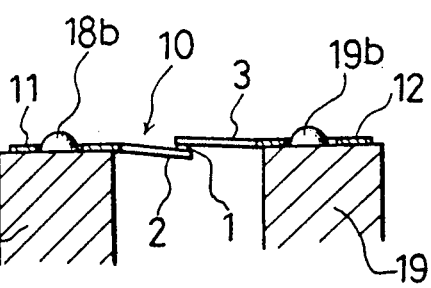
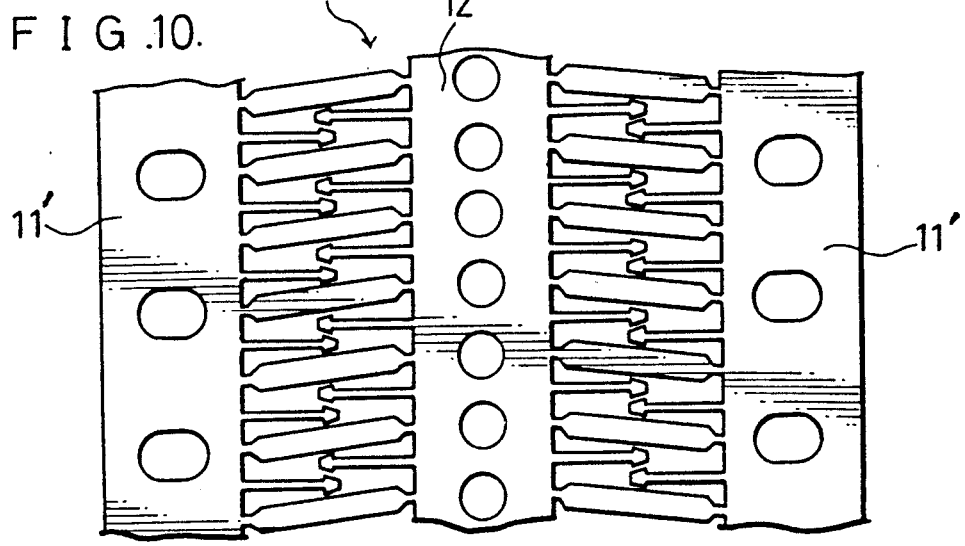

METHOD OF MANUFACTURING SEMICONDUCTOR DEVICES, AND LEADFRAME AND DIFFERENTIAL OVERLAPPING APPARATUS THEREFOR

BACKGROUND OF THE INVENTION

1. Field of the Invention:

This invention relates to a method of manufacturing semiconductor devices from a continuous length of leadframe. It more particularly relates to a method of producing semiconductor devices of the type wherein each semiconductor chip is sandwiched between at least one pair of leads for bonding and encapsulated hermetically in a molded resinous body. The invention also relates to a leadframe and a differential overlapping mechanism for advantageously carrying out the method.

2. Description of the Prior Art:

As is well known, elongated or continuous leadframes are used for quantity production of semiconductor devices, such as diodes, transistors, and so on. Various attempts have heretofore been made to improve the productivity of such a manufacturing process and to simplify the process in addition to enhancing the quality of the products.

Two typical prior art methods of manufacturing semiconductor devices are now described with reference to FIGS. 15 to 18 of the accompanying drawings for the convenience of explanation.

In one typical prior art method shown in FIGS. 15 to 17, a pair of parallel leadframes A, B respectively formed with aligned leads 2', 3' at a constant pitch P' are transferred longitudinally thereof, as indicated by the arrows. During such transfer, semiconductor chips 1' are bonded to the respective leads 2 of one leadframe A, as shown in FIG. 16. Subsequently, the pair of leadframes A, B are brought closer to each other, so that the leads 3' of the other leadframe B is overlapped on the chips 1' for bonding thereto, as shown in FIG. 17. Finally, each chip 1' together with the associated leads 2', 3' is encapsulated in a molded resin body 4' which is cut off from the respective leadframes A, B to provide an individual semiconductor product.

However, the above prior art method is disadvantageous in that two separate leadframes A, B are requried for production of semiconductor devices, thereby posing handling inconvenience (e.g. requiring two separate transfer guides, and etc.) in addition to involving material waste. Further, because of the separate nature of the leadframes A, B, the respective leads 2, 3, which are kept free as projecting, are likely to come into contact with external objects particularly when the leadframes A, B are separately handled. As a result, the leads may be subjected to unacceptable deformation during the manufacturing process, consequently resulting in a higher chance of quality deterioration.

According to another prior art method shown in FIG. 18 of the accompanying drawings and disclosed for example in Japanese Patent Application Laid-open No. 62-35549 (Laid-open: Feb. 16, 1987; Application No.: 60-176036; Filed: Aug. 8, 1985; Applicant: Mitsubishi Electric Corp.), an integral leadframe C is used which includes a pair of longitudinal bands C1, C2 connected together by bar-like connecting segments C3 spaced longitudinally of the leadframe at a constant pitch P". One longitudinal band C1 is formed with a group of longer leads 2" which are spaced longitudinally of the leadframe and extend toward the other longitudinal band C2, whereas the other band C2 is formed with a group of shorter leads 3" which are also spaced longitudinally of the leadframe but extend toward the one longitudinal band C1 in staggered relation to the group of longer leads 2".

In manufacture, the integral leadframe C is transferred longitudinally thereof, as indicated by an arrow. During such transfer, a semiconductor chip 1" is bonded to each shorter lead 3". Subsequently, a corresponding longer lead 2" is bent along a bending line C4, so that the bent portion is overlapped on a corresponding chip 1". Finally, the chip together with the associated leads is hermetically molded in a resin body 4", and cut off from the leadframe to provide an individual semiconductor product.

Compared with the method shown in FIGS. 15 to 17, the method of FIG. 18 is advantageous in that semiconductor devices can be produced from the single leadframe C which enables easier handling. Further, all of the leads 2", 3" are always located in the same plane of the leadframe throughout various stages of the manufacturing process. Thus, the longitudinal space between the two longitudinal bands C1, C2 is an area always protected by these bands, so that the leads 2", 3" arranged in this protected area are less likely to come into contact with external objects. Therefore, it is possible to avoid unexpected deformation of the leads, thereby improving the quality of the final products.

However, the prior art method of FIG. 18 is also disadvantageous in various points. First, the bent portion of each longer lead 2" causes a weight increase of the individual semiconductor device in addition to involving material waste. Second, each pair of leads 2", 3" are spaced longitudinally of the leadframe C before and after the molding operation, so that the resulting product must necessarily have an increased width S which also causes a weight increase. Third, this width increase also results in decrease in number of the products obtainable per unit length of the leadframe C, thus causing material waste.

More importantly, the bending of the longer leads necessitates a slowdown in the transfer speed of the leadframe. Combined with the width increase of the individual products (therefore a length increase of the leadframe), such a slowdown greatly reduces the productivity of the manufacturing process, consequently resulting in a cost increase.

SUMMARY OF THE INVENTION

It is, therefore, an object of the present invention to provide a method of manufacturing semiconductor devices wherein the above described problems of the prior art are eliminated or reduced.

Another object of the present invention is to provide a leadframe which is particularly suitable for carrying out the method of the present invention.

A further object of the present invention is to provide a differential overlapping mechanism or apparatus which can be advantageously used for carrying out the method of the present invention.

Still another object of the present invention is to provide a modified leadframe which enables doubling of the productivity.

Still further object of the present invention is to enable adjustment of the differential overlapping mechanism depending on the types or dimensions of leadframes to be used or the types or dimensions of semiconductor devices to be produced.

Still further object of the present invention is to enable slip-free transfer of the leadframe through the differential overlapping mechanism.

According one aspect of the present invention, there is provided a method of manufacturing semiconductor devices from an elongated leadframe which comprises at least two transversely spaced longitudinal bands connected together by connecting segments spaced longitudinally of the leadframe, one longitudinal band being formed with a first group of leads spaced longitudinally of the leadframe and extending toward the other longitudinal band, the other longitudinal band being formed with a second group of leads spaced longitudinally of the leadframe and extending toward the one longitudinal band in staggered relation to the first group of leads, the method comprising the steps of: transferring the leadframe longitudinally thereof; bonding semiconductor chips to the first group of leads during transfer of the leadframe; causing the two bands to displace away from each other perpendicularly to a plane containing the leadframe; causing the two bands to move relative to each other longitudinally of the leadframe so that each lead of the first group assumes substantially the same longitudinal position as a corresponding lead of the second group; and causing the two bands to displace toward each other perpendicularly to the plane of the leadframe so that a semiconductor chip on each lead of the first group comes into contact with the corresponding lead of the second group for bonding.

According to the method described above, the leadframe to be used is an integral piece, so that it may be handled very conveniently throughout the entire manufacturing process with less likelihood of the individual leads being deformed by unexpected contact with external objects.

The first group of leads and the second groups of leads are initially arranged in staggered relation. However, the two longitudinal bands are displaced relative to each other perpendicularly to the plane of the leadframe and longitudinally of the leadframe, so that the first group leads assume the same longitudinal positions as the second group leads with the individual semiconductor chips interposed therebetween. Thus, the resulting semiconductor products may have reduced width and weight, the width reduction also contributing to prevention of material waste and to enhancement of productivity.

Further, the method of the present invention requires no lateral bending of the leads. Thus, the leadframe may be transferred at a high speed, consequently realizing improved productivity and decreased production cost.

The present invention also provides an improvement in the leadframe referred above in connection with the method. More specifically, the improvement of the leadframe resides in that each of the bar-like connecting segments has a pair of narrower neck portions for connection to the respective longitudinal bands.

When the two longitudinal bands of the leadframe are displaced relative to each other longitudinally thereof, each bar-like connecting segment is deformed under a bending force. If the connecting segment has a constant width over its entire length, the bending force is evenly distributed throughout the segment which, for this reason, may be arcuately deformed within the elasticity limit. The connecting segment thus deformed acts as a spring tending to restore to its original state. Thus, the leadframe, which has been longitudinally deformed, may spring back to its original state after all external forces have been relieved, consequently giving adverse influences on subsequent procedure.

With the preferred or improved leadframe described above, each connecting segment has a pair of narrower neck portions which provide positions for stress concentration and easy deformation when the two longitudinal bands are displaced relative to each other longitudinally of the leadframe. Thus, the connecting segment is permanently deformed at these neck portions, thereby preventing or mitigating the unwanted spring-back phenomenon of the leadframe described above.

The present invention further provides a differential overlapping apparatus which can be advantageously used for the method of the invention. Specifically, the differential overlapping apparatus comprises: a first feed wheel arranged in a path of transfer of the leadframe and driven into rotation to have a specified circumferential speed, the first feed wheel having an outer circumference which provides a contact arc for coming into feeding contact with one longitudinal band of the leadframe; and a second feed wheel arranged in side-by-side relation to the first feed wheel and driven into rotation to have the same circumferential speed as the first feed wheel, the second feed wheel having an outer circumference which provides a contact arc for coming into contact with the other longitudinal band of the leadframe, the contact arc of the second feed wheel being longer than the contact arc of the first feed wheel and positioned radially outwardly thereof.

According to the arrangement described above, the contact arc of the second feed wheel is longer than that of the first feed wheel. However, since the two feed wheels are rotated to have the same circumferential speed, a particular length of the one longitudinal band passes through the first feed wheel within a shorter time than a corresponding length of the other longitudinal band passes through the second feed wheel. Thus, the one longitudinal band will have advanced relative to the other longitudinal band after passage through the respective feed wheels. Further, since the contact arc of the second feed wheel is located radially outside that of the first feed wheel, the two longitudinal bands are separated from each other perpendicularly to the plane of the leadframe. In this way, it is possible to overlap the leads of the one longitudinal band onto the counterpart leads of the other longitudinal band.

Obviously, the differential overlapping apparatus according to the present invention is advantageous in the simplicity of the arrangement because it requires only two feed wheels arranged in side-by-side relation. It is, of course, possible to combine the feed wheels with other mechanisms which would help the operation of differential overlapping, as described hereinafter.

Other objects, features and advantages of the present invention will be fully understood from the following detailed description given with reference to the accompanying drawings.

BRIEF DESCRIPTION OF THE DRAWINGS

In the accompanying drawings:

FIG. 7 is a front view showing a differential overlapping mechanism according to the present invention;

FIG. 8 is a sectional view taken on lines VIII—VIII in FIG. 7;

FIG. 9 is a sectional view taken on lines IX—IX in FIG. 7;

FIG. 10 is a plan view showing another leadframe according to the present invention;

DETAILED DESCRIPTION

Figure 1:
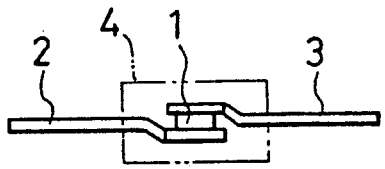
FIG. 1 is a side view showing a diode as an example of semiconductor devices to be produced by using the present invention.
Figure 2:
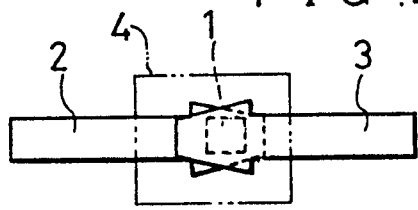
FIG. 2 is a plan view showing the same diode.

Referring now to FIGS. 1 and 2, there is shown a semiconductor device which can be advantageously manufactured from a leadframe according to the present invention. The semiconductor device is illustrated as being in the form of a diode which comprises a semiconductor chip 1 held in conduction with a pair of external leads 2, 3 and hermetically encapsulated in a molded resin body 4.

Figure 3:
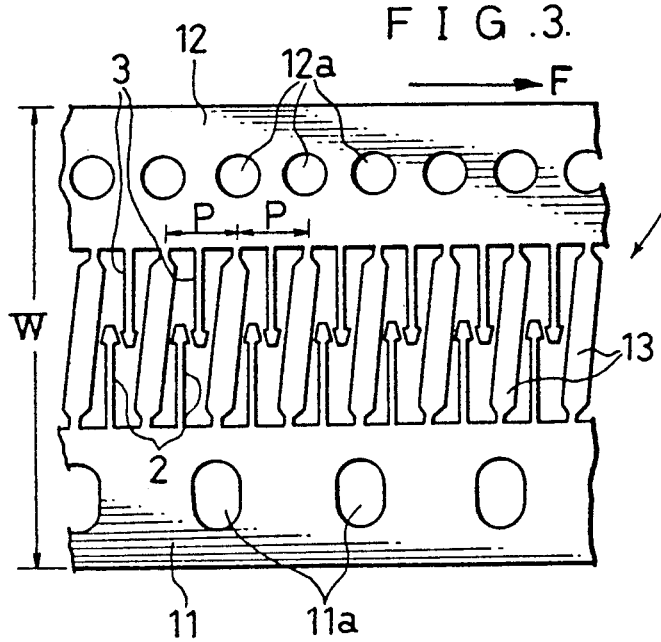
FIG. 3 is a plan view showing a leadframe according to the present invention.
Figure 4:
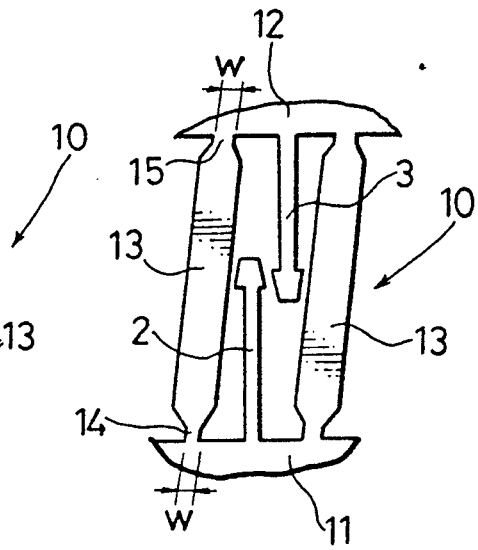
FIG. 4 is an enlarged fragmentary plan view showing a principal portion of the leadframe shown in FIG. 3.

The leadframe embodying the present invention is illustrated in FIGS. 3 and 4. This leadframe, which is generally designated by reference numeral 10, includes a pair of longitudinal bands 11, 12 connected to each other by means of bar-like connecting segments 13. The leadframe may be formed from a metallic plate to have a suitable width W and a substantially continuous length.

One longitudinal band 11 (hereafter referred to as "first band") is integrally formed with leads 2 respectively arranged between the connecting segments 13. The other longitudinal band 12 (hereafter referred to as "second band") is also formed with integral leads 3 in corresponding relation to the leads 2 of the first band to provide lead pairs arranged within the respective spaces between the connecting segments. Each pair of leads 2, 3 extend toward each other in staggered relation.

The connecting segments 13 are spaced from each other longitudinally of the leadframe at a suitable pitch P. According to the preferred embodiment shown in FIGS. 3 and 4, each connecting segment is inclined relative to the transverse direction of the leadframe 10, and has a pair of neck portions 14, 15 of a narrower width w for connection to the respective longitudinal bands 11, 12.

Figure 5:
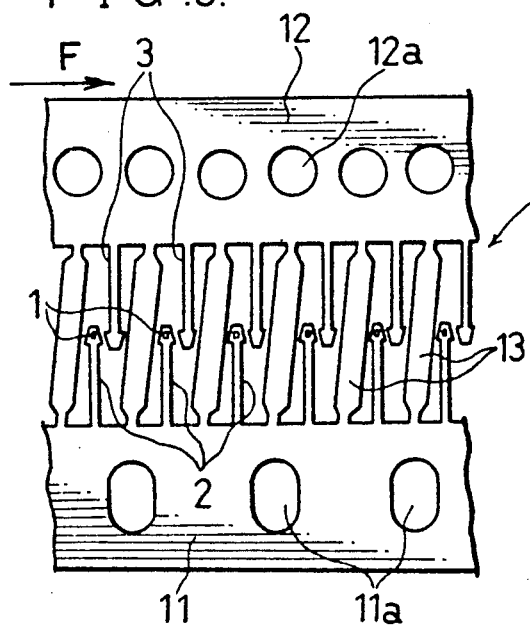
FIG. 5 is a plan view similar to FIG. 3 but showing the leadframe after a first stage of chip bonding.
Figure 6:
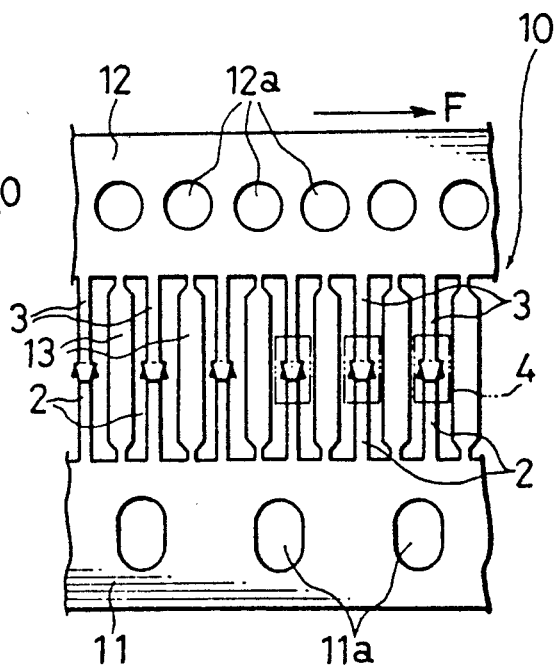
FIG. 6 is a plan view also similar to FIG. 3 but showing the leadframe after final stage of chip bonding.

For manufacture of semiconductor devices, the leadframe 10 is transferred longitudinally thereof, as indicated by an arrow F in FIG. 5. During such transfer, semiconductor chips 1 are bonded onto the tips of the respective leads 2 of the first longitudinal band 11. Upon subsequent transfer, the leadframe is passed through a differential overlapping mechanism to be described below, whereby each pair of leads 2, 3 overlap each other, as illustrated in FIG. 6.

As shown in FIGS. 7 to 9, the differential overlapping mechanism, which is arranged between a pair of guide rollers 16, 17 for longitudinally guiding the leadframe 10, comprises a diametrically larger feed wheel 18 and a diametrically smaller feed wheel 19. The larger feed wheel 18, which is drivingly rotated on a shaft 18a, comes in feeding contact with the first longitudinal band 11 of the leadframe. The smaller feed wheel 19, which is drivingly rotated on a shaft 19a, comes in feeding contact with the second longitudinal band 12 of the leadframe, and has an outer circumference located partially outside and above the outer circumference of the larger feed wheel by a suitable amount H. The two wheels 18, 19 are rotated in the same rotational direction R and at the same circumferential speed.

The outer circumference of the larger feed wheel 18 is provided with equiangularly spaced engaging projections 18b for successive engagement with correspondingly spaced indexing holes 11a (see FIG. 5) of the first longitudinal band 11. Similarly, the outer circumference of the smaller wheel 19 is provided with equiangularly spaced engaging projections 19b for successive engagement with correspondingly spaced indexing holes 12a (see FIG. 5) of the second longitudinal band 12. In this way, the leadframe 10 passes through the differential overlapping mechanism without slippage. Alternatively, the two wheels 18, 19 may be constituted by gears or sprockets.

As illustrated in FIG. 7, the larger feed wheel 18 comes into feeding contact with the first longitudinal band 11 of the leadframe 10 along a larger diameter arc, whereas the smaller feed wheel 19 comes into feeding contact with the second longitudinal band 12 of the leadframe along a smaller diameter arc. Both ends of the larger diameter arc are located substantially at the same positions as those of the smaller diameter arc. However, since the smaller diameter arc is displaced radially outwardly of the larger diameter arc by the amount H, the former is larger in length than the latter. Thus, when the two diametrically different feed wheels 18, 19 are rotated at the same circumferential speed, each lead 2 of the first longitudinal band 11 catches up the corresponding lead 3 of the second longitudinal band 12 upon complete passage over the respective feed wheels.

Further, the positional deviation H between the respective contact arcs of the two feed wheels 18, 19 results in that each lead 2 of the first longitudinal band 11 of the leadframe 10 displaces to a position under the corresponding lead 3 of the second longitudinal band 12 during passage of the leadframe through the feed wheels, as best illustrated in FIG. 8. Thus, combined with the longitudinal deviation described above, the lead 2 of the first longitudinal band 11 overlaps the corresponding lead 3 of the second longitudinal band 12 after complete passage over the feed wheels, as shown in FIGS. 6 and 9. In this way, each semiconductor chip 1 bonded in advance to the lead 2 may be bonded to the other (couterpart) lead 3 as a result of processing within the differential overlapping mechanism.

To sum up, the differential overlapping mechanism has two important functions. First, this mechanism causes the first longitudinal band 11 to slightly advance relative to the second longitudinal band 12 longitudinally of the leadframe 10. Second, the overlapping mechanism provides a level difference between the two longitudinal bands 11, 12 to enable overlapping between the pairs of leads 2, 3. It should be appreciated here that the relative longitudinal movement between the two longitudinal bands 11, 12 occurs only upon passage of the leadframe 10 through the overlapping mechanism but not before and after it because the two feed wheels 18, 19, though having different contact lengths, rotate at the same circumferential speed to feed the two longitudinal bands at the same speed as a whole.

Obviously, each connecting segment 13 is deformed when the two longitudinal bands 11, 12 are displaced relative to each other longitudinally of the leadframe 10. The narrower neck portions 14, 15 (FIG. 4) of the connecting segment 13 provide positions for stress concentration to ensure that the segment is permanently deformed at these positions to prevent subsequent spring-back phenomenon of the leadframe. Moreover, the connecting segment 13 remains substantially straight as a whole even after such deformation.

Further, each connecting segment 13 is initially inclined relative to the transverse direction of the leadframe 10, as already described. However, when the two longitudinal bands 11, 12 are displaced relative to each other longitudinally of the leadframe, the connecting segment is deformed to become perpendicular to the leadframe, as shown in FIG. 6. As a result, the spaces between the respective connecting segments 13 become substantially rectangular to accommodate the respective molded resin bodies 4 which are subsequently formed within these spaces to become also rectangular. According to this arrangement, the pitch P (see FIG. 3) may be made as small as possible to increase the number of semiconductor devices to be produced per unit length of the leadframe 10.

In the last stage of production, each semiconductor device thus formed is separated from the leadframe 10 to provide the final product shown in FIGS. 1 and 2.

The present invention is not limited to the particular leadframe 10 shown in FIGS. 3 to 6, wherein the two longitudinal bands 11, 12 are arranged to produce only one row of semiconductor devices. In fact, the leadframe may be modified to produce two or more rows of semiconductor devices.

FIG. 10 shows one example of such modifications. Specifically, the modified leadframe 10' has a central longitudinal band 12' (second longitudinal band) on both sides of which are disposed a pair of side longitudinal bands 11' (first longitudinal bands) to enable successive production of semiconductor devices in two rows, thereby doubling productivity. As readily understood, a differential overlapping mechanism suitable for such a leadframe may comprise a central smaller feed wheel for feeding contact with the central longitudinal band 12', and a pair of larger feed wheels arranged on both sides of the central wheel to come into feeding contact with the side longitudinal bands 11'.

FIGS. 11 to 14 show a modified differential overlapping mechanism according to the present invention. As shown, the modified overlapping mechanism, which is arranged between a pair of guide rollers 16, 17 for longitudinally guiding the leadframe 10, comprises a smaller feed wheel 20 having a diameter d (FIG. 13), and a larger feed wheel 21 having a larger diameter D. The smaller feed wheel 20 drivingly rotated on a shaft 20a comes in feeding contact with the first longitudinal band 11 of the leadframe. The larger feed wheel 21, which is drivingly rotated on a shaft 21a coaxial with the other shaft 20a, comes in feeding contact with the second longitudinal band 12. The smaller wheel 20 is rotated at a higher rotational speed than the larger wheel 21, so that these two wheels have the same circumferential speed.

A first nipping roller mechanism 22 is disposed between the upstream guide roller 16 and the feed rollers 20, 21. Similarly, a second nipping roller mechanism 23 is arranged between the downstream guide roller 17 and the feed rollers.

Figure 12:
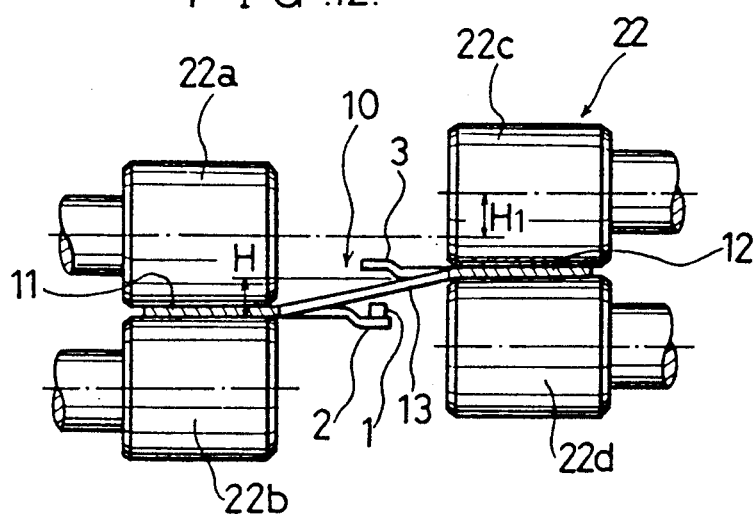
FIG. 12 is a sectional view taken on lines XII—XII in FIG. 11.
Figure 13:
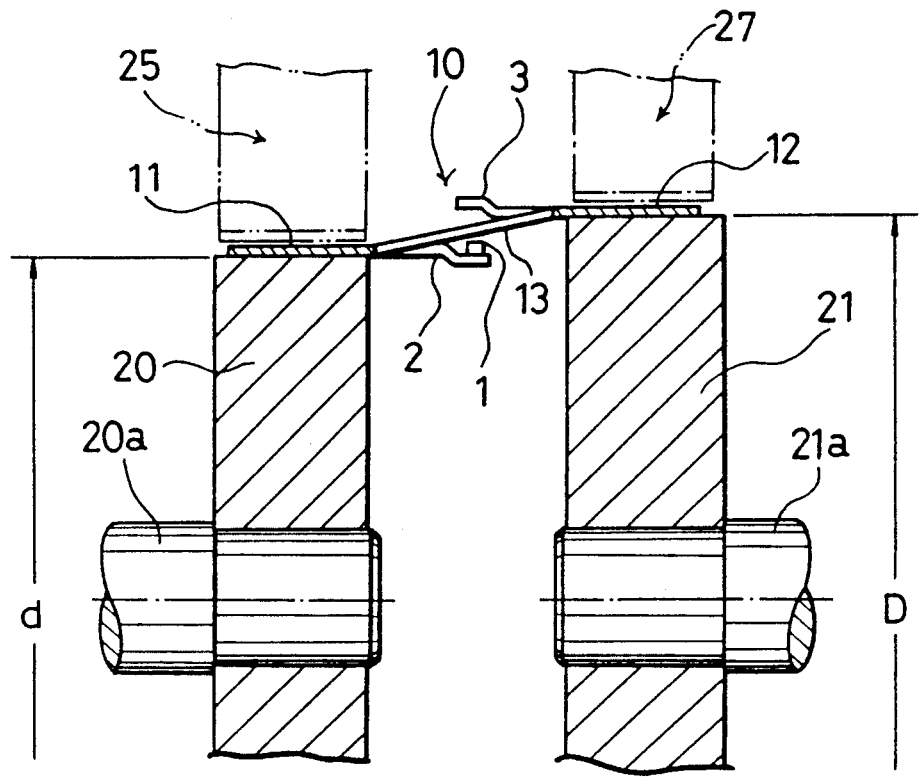
FIG. 13 is a sectional view taken on lines XIII—XIII in FIG. 11.

As shown in FIG. 12, the first nipping roller mechanism 22 includes a pair of nipping rollers 22a, 22b for nipping and downwardly forcing the first longitudinal band 11 of the leadframe 10. The first nipping roller mechanism further includes another pair of nipping rollers 22c, 22d for nipping and upwardly forcing the second longitudinal band 12.

Figure 14:
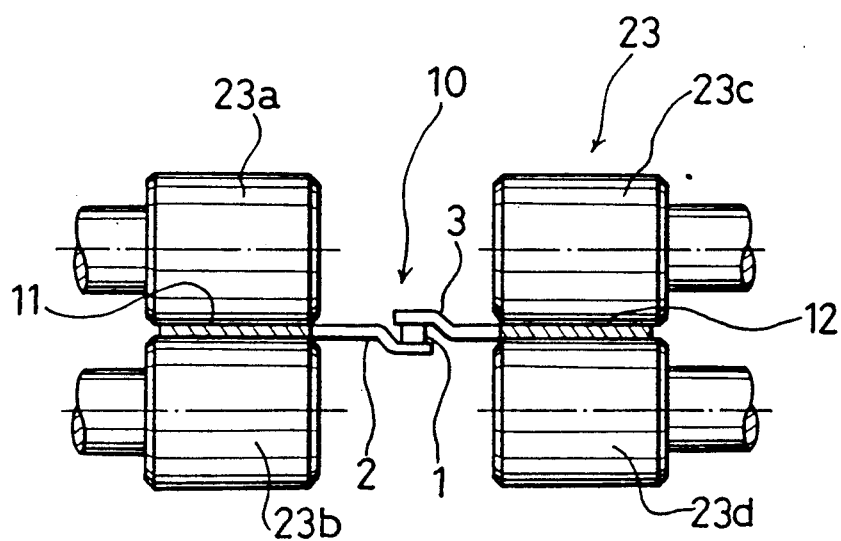
FIG. 14 is a sectional view taken on lines XIV-XIV in FIG. 11.
Figure 15:
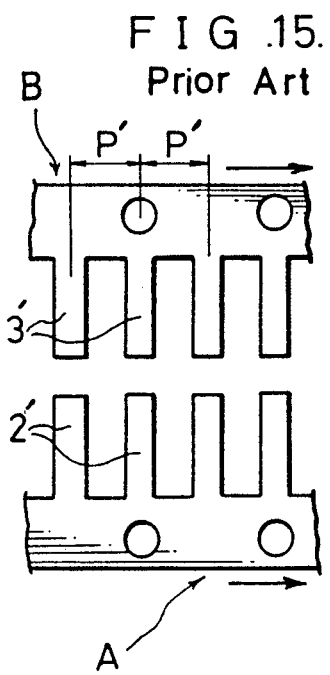
FIGS. 15 to 17 are plan views showing the successive stages of a prior art method for manufacturing semiconductor devices.
Figure 16:
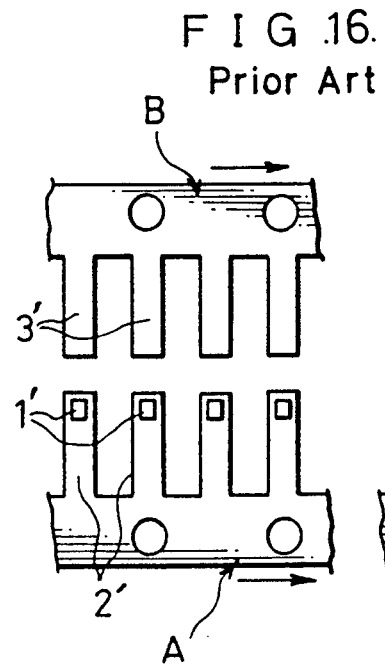
Figure 17:
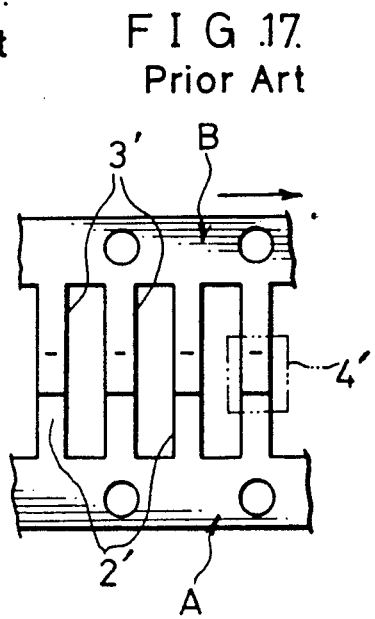
Figure 18:
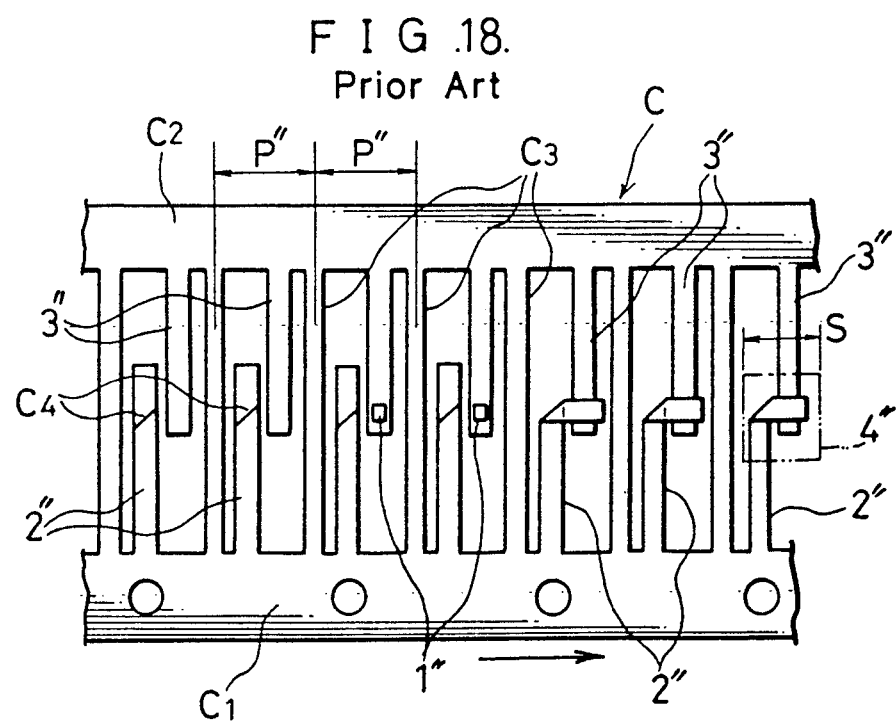
FIG. 18 is a plan view showing another prior art method of manufacturing semiconductor devices.

As shown in FIG. 14, the second nipping roller mechanism 23 includes a pair of nipping rollers 23a, 23b for nipping and upwardly forcing the first longitudinal band 11 of the leadframe 10. The second nipping roller mechanism further incorporates another pair of nipping rollers 23c, 23d for nipping and downwardly forcing the second longitudinal band 12.

Figure 11:
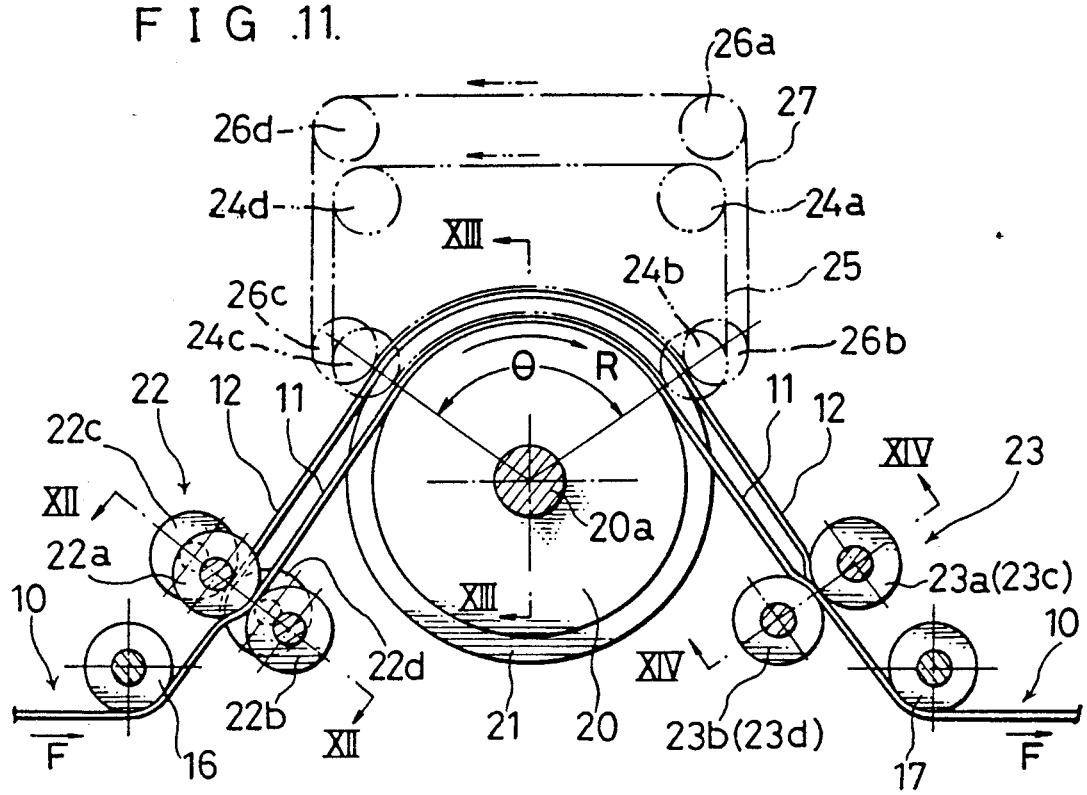
FIG. 11 is a front view showing another differential overlapping mechanism according to the present invention.

With the arrangement described above, the leadframe 10 is transferred longitudinally thereof by the driving rotation of the two feed wheels 20, 21, as indicated by the arrows F in FIG. 11.

When the leadframe 10 passes through the first nipping roller mechanism 22, the two longitudinal bands 11, 12 are forced respectively downward and upward by the two pairs of nipping rollers 22a-22d, as already described. As a result, the two longitudinal bands 11, 12 are separated perpendicularly to the plane of the leadframe 10 by an amount H, as shown in FIG. 12. This deviation H substantially corresponds to the difference in radius between the two feed wheels 20, 21, and may be adjusted by altering the difference H1 in axis position between the two different pairs of nipping rollers 22a, 22b and 22c, 22d.

As shown in FIG. 11, the two diametrically different feed wheels 20, 21 come into contact with the respective longitudinal bands 11, 12 of the leadframe 10 over substantially the same angle $\theta$, so that the contact arc of the larger feed wheel 21 is longer than that of the smaller feed wheel 20 because of the diametrical difference between the two wheels. However, since the two feed wheels are rotated to have the same circumferential speed, the first longitudinal band 11 is advanced relative to the second longitudinal band 12 longitudinally of the leadframe 10 upon passage over the respective feed wheels.

When the leadframe 10 passes through the second nipping roller mechanism 23, the two longitudinal bands 11, 12 are pressed by this roller mechanism toward each other, as already described. As a result, each lead 2 of the first longitudinal band 11 is overlapped with the corresponding lead 3 of the second longitudinal band 12 with the semiconductor chip 1 interposed therebetween, as shown in FIG. 14.

According the embodiment illustrated in FIGS. 11 to 14, the degree of relative longitudinal displacement between the two longitudinal bands 11, 12 of the leadframe 10 may be adjusted by changing the diametrical difference between the two feed wheels 20, 21 and/or by varying the angle $\theta$ for contact with the two longitudinal bands. The contact angle $\theta$, on the other hand, may be adjusted by vertically displacing the two feed wheels 20, 21 and/or by vertically or horizontally displacing at least one of the two nipping roller mechanisms 22, 23. By such adjustability, it is possible to use differently dimensioned leadframes to produce differently dimensioned semiconductor products.

In order to prevent slippage between the leadframe 10 and the feed wheels 20, 21, the feed wheels may be externally formed with engaging projections for feeding engagement with corresponding indexing holes of the longitudinal bands 11, 12, as described in connection with the previous embodiment. In this case, however, it is feared that the indexing holes of the leadframe may deformed by engagement with the engaging projections of the feed wheels, consequently leading to a difficulty in accurately transferring the leadframe.

In view of such a problem, the differential overlapping mechanism shown in FIG. 11 further incorporates a first pressing feed mechanism to cooperate with the smaller feed wheel 20, and a second pressing feed mechanism to cooperate with the larger feed wheel 21, as indicated in phantom lines. More specifically, the first pressing feed mechanism comprises a first set of pulleys 24a-24d for guiding a first endless belt 25 in pressing contact with the first longitudinal band 11 of the leadframe 10. Similarly, the second pressing feed mechanism comprises a second set of pulleys 26a-26d for guiding a second endless belt 27 in pressing contact with the second longitudinal band 12.

One pulley 24a of the first pulley set and one pulley 26a of the second pulley set are used as drive pulleys which have the same diameter and are rotated at the same rotational speed. In this way, the two endless belts 25, 27 are driven at the same speed, whereby the two feed wheels 20, 21 are also driven into rotation to have the same circumferential speed even if the feed wheels are diametrically different.

According to the feeding arrangement shown in FIG. 11, each longitudinal band 11 or 12 of the leadframe 10 is sandwiched between the corresponding endless belt 25 or 27 and feed wheel 20 or 21 with a sufficient friction to prevent slippage during transfer of the leadframe. A further advantage of this feeding arrangement is that the combination of the pulley sets and the endless belts provides a simplified drive mechanism for rotating the two diametrically different feed wheels 20, 21 at the same circumferential speed.

The present invention being thus described, it is obvious that the same may be varied in many other ways. For instance, semiconductor chips 1 may be first bonded to the leads 3 of the second longitudinal band 12 of the leadframe 10, whereafter the first longitudinal band 11 is raised and longitudinally advanced relative to the second longitudinal band 12 to overlap the leads 2 of the first band 11 onto the counterpart leads 3 from above. Further, it is also possible to first bond the semiconductor chips 1 to the underside of the leads 3, whereafter the first band 11 is lowered and longitudinally advanced relative to the second band 12 to overlap the leads 2 onto the counterpart leads 3 from below. Such variations are not to be regarded as a departure from the spirit and scope of the present invention, and all such modifications as would be obvious to those skilled in the art intended to be included in the scope of the following claims.

What is claimed is:

1. A differential overlapping apparatus for use in manufacturing semiconductor devices from an elongated leadframe which comprises at least two transversely spaced longitudinal bands connected together by connecting segments spaced longitudinally of said leadframe, one longitudinal band being formed with a first group of leads spaced longitudinally of said leadframe and extending toward the other longitudinal band, said other band being formed with a second group of leads spaced longitudinally of said leadframe and extending toward said one band in staggered relation to said first group of leads, the apparatus comprising:
    a first feed wheel arranged in a path of transfer of said leadframe and driven into rotation to have a specified circumferential speed, said first feed wheel having an outer circumference which provides a contact arc for coming into feeding contact with said one longitudinal band; and
    a second feed wheel arranged in side-by-side relation to said first feed wheel and driven into rotation to have the same circumferential speed as said first feed wheel, said second feed wheel having an outer circumference which provides a contact arc for coming into contact with said other longitudinal band, said contact arc of said second feed wheel being longer than said contact arc of said first feed wheel and positioned radially outwardly thereof.

2. The apparatus as defined in claim 1, wherein said first feed wheel is eccentric relative to and diametrically larger than said second feed wheel.

3. The apparatus as defined in claim 1, wherein each of said first and second feed wheels is formed on its outer circumference with equiangularly spaced engaging projections for slip-free engagement with indexing holes formed in a corresponding one of said two longitudinal bands.

4. The apparatus as defined in claim 1, wherein said first feed wheel is concentric relative to and diametrically smaller than said second feed wheel.

5. The apparatus as defined in claim 4, further comprising a first displacing mechanism arranged before said first and second feed wheels for displacing said two longitudinal bands away from each other perpendicularly to a plane containing said leadframe, and a second displacing mechanism arranged behind said first and second feed wheels for displacing said two longitudinal bands toward each other perpendicularly to said plane.

6. The apparatus as defined in claim 5, wherein said first displacing mechanism comprises two pairs of nipping rollers for sandwiching said two longitudinal bands respectively, said two pairs of nipping rollers providing respective nipping positions displaced in a direction perpendicular to said plane.

7. The apparatus as defined in claim 5, wherein said second displacing mechanism comprises two pairs of nipping rollers for sandwiching said two longitudinal bands respectively, said two pairs of nipping rollers providing respective nipping positions positioned in the same plane as said leadframe.

8. The apparatus as defined in claim 1, further comprising a first endless belt guided by a first set of pulleys for pressing said one longitudinal band against said contact arc of said first feed wheel, and a second endless belt guided by a second set of pulleys for pressing said other longitudinal band against said contact arc of said second feed wheel.

9. The apparatus as defined in claim 8, wherein one pulley of said first set and one pulley of said second set are equal in diameter and rotated at the same rotational speed.

* * * * *